United States Patent [19]

Nazarian et al.

[11] 4,243,895
[45] Jan. 6, 1981

[54] INTEGRATED INJECTION CIRCUIT

[76] Inventors: Artashes R. Nazarian, ploschad Junosti, 3, kv. 16; Vyacheslav Y. Kremlev, korpus 423, kv. 81; Vilyam N. Kokin, korpus 441, kv. 115; Viktor I. Sladkov, Berezovaya alleya, 6, kv. 77; Boris V. Venkov, korpus 206, kv. 46, all of Moscow; Vadim V. Lavrov, ulitsa 8 Marta, 7, kv. 125, Khimki Moskovskoi oblasti, all of U.S.S.R.

[21] Appl. No.: 866,821

[22] Filed: Jan. 4, 1978

[51] Int. Cl.³ ............... H03K 19/017; H03K 19/094; H03K 19/20; H01L 29/80

[52] U.S. Cl. ..................................... 307/205; 357/15; 307/213; 357/22; 357/92

[58] Field of Search ............... 307/203, 213, 215, 214; 357/92

[56] References Cited

U.S. PATENT DOCUMENTS

| 3,912,546 | 10/1975 | Hunsperger et al. | 357/22 X |
|---|---|---|---|
| 3,987,310 | 10/1976 | Peltier et al. | 307/214 X |
| 4,035,664 | 7/1977 | Berger et al. | 307/213 X |
| 4,076,556 | 2/1978 | Agraz-Guerena et al. | 357/92 X |
| 4,101,349 | 7/1978 | Roesner et al. | 357/92 X |
| 4,110,634 | 8/1978 | Tokumaru et al. | 307/213 |

OTHER PUBLICATIONS

*Electronics* (pub.); "Junction Field-Effect Transistor Design for Speedy Logic," pp. 4E, 6E; Aug. 19, 1976.
Berger et al., "Advanced Merged Transistor Logic by Using Schottky Junctions," *Microelectronics*, vol. 7, No. 3, pp. 35-42, 1976.
Poorter, "Electrical Parameters, Static and Dynamic Response of I²L," *IEEE-JSSC*, vol. SC-12, No. 5, pp. 440-449, Oct. 1977.
Hewlett, Jr., "Schottky I²L," *IEEE-JSSC*, vol. SC-10, No. 5, pp. 343-348, Oct. 1975.

*Primary Examiner*—Larry N. Anagnos
*Attorney, Agent, or Firm*—Lackenbach, Lilling & Siegel

[57] ABSTRACT

An integrated injection circuit is proposed which comprises a current generator and a normally cutoff n-channel field-effect transistor. The gate of the FET is connected to the current generator and to the input electrode of the circuit, the source is grounded and the drain is connected to the output electrode of the circuit. The gate of the FET is designed as at least one noninjecting rectifying contact.

11 Claims, 6 Drawing Figures

INTEGRATED INJECTION CIRCUIT

FIELD OF THE INVENTION

The present invention relates to microelectronics technology and in particular to large-scale integrated injection circuits intended primarily for digital computers.

DESCRIPTION OF THE PRIOR ART

Known in the art are integrated injection circuits which comprise a current generator and a normally cutoff n-channel field-effect transistor wherein the gate is connected to the current generator and to the input electrode of the circuit, the source is grounded and the drain is connected to the output electrode of the circuit.

Such integrated injection circuits suffer from a comparatively low speed which is caused by the fact that a space charge of carriers injected by the p-n gate-source junction is accumulated in the source zone. When the supply current is increased in such a circuit to decrease the time required to charge the structure capacities, the charge that has accumulated in the source zone will increase. Hence, the time required for its spread-out will also increase. In other words, the circuit's total switching delay time will increase. Further, the circuit has a comparatively great surface which is due to the fact that in the course of field-effect transistor gate forming impurities will penetrate at the sides of the structure to the zone below the masking oxide. In addition, certain tolerances have to be provided for the alignment between the mask windows for contacts with the gate and the drain zones and the mask windows in order to provide the diffusion of impurities into the gate zone in the course of the drain zone forming procedure.

SUMMARY OF THE INVENTION

The primary object of the invention is to increase the speed of operation of an integrated injection circuit.

Another object is to increase the packing density of an integrated injection circuit.

The essence of the invention consists in providing an integrated injection circuit comprising a current generator and a normally cutoff n-channel field-effect transistor having its gate connected to the current generator and to the input electrode of the circuit, its source grounded and its drain connected to the output electrode of the circuit wherein. According to the invention, the gate of the field-effect transistor is made as at least one non-injecting rectifying contact.

In order to increase the number of possible functional applications of the circuit a preferred embodiment comprises a field-effect transistor having two non-injecting contacts and a complementary input electrode, the second non-injecting contact being connected to said complementary input electrode.

In order to increase the packing density the preferred embodiment comprises a current generator having a bipolar transistor with a metal collector which is combined with the gate of the field-effect transistor.

Preferably the integrated circuit is made as a semiconductor structure provided with a current generator having a bipolar planar transistor and a planar field-effect transistor having its gate zone located on the surface of the substrate and its metal interconnections located on the masking dielectric layer. The gate zones of the field-effect transistor should be made as interconnection sections located on the unmasked areas of the substrate surface and protected with a dielectric layer from above, the layer having its drain zone above it so as to form an ohmic contact with the substrate within the area overlapped by the zones where the space charge of the non-injecting rectifying contacts of the gate zones is accumulated.

In order to simplify the production procedure a preferred embodiment of the integrated circuit comprises a substrate wherein a complementary zone is provided at a distance from the surface which does not exceed the thickness of the space charge layer produced by the non-injecting rectifying contact of the gate zone, the conductivity of the complementary zone being opposite to that of the substrate, this zone overlapping completely the ohmic contact between the drain zone and the substrate.

BRIEF DESCRIPTION OF THE DRAWINGS

The invention will be better understood from the following description of its embodiments given by way of example with reference to the accompanying drawings in which.

DETAILED DESCRIPTION OF THE INVENTION

Figure 1:
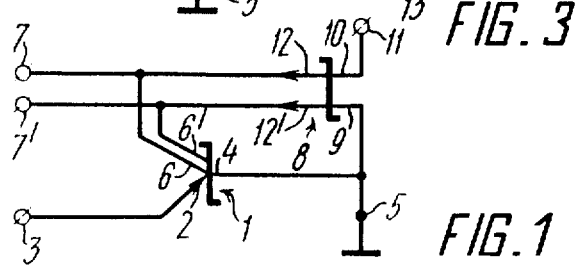
FIG. 1 is a circuit diagram of the integrated injection circuit, according to the invention, which performs the functions of a NOR gate.

Presented in FIG. 1 is a circuit diagram of one of the versions of the integrated circuit proposed in the present invention which performs the functions of a logical gate.

The logical gate comprises a current generator with a bipolar transistor 1 having its emitter 2 connected to an electrode 3 of the supply network (not shown in FIG. 1), its base 4 connected to a ground electrode 5 and its collectors 6 and 6' connected to input electrodes 7 and 7' of the logical gate, respectively. In addition, the logical gate comprises a normally cutoff n-channel field-effect transistor 8 with its source zone 9 connected to the ground electrode 5, its drain zone 10 connected to an output electrode 11 and its gate zones 12 and 12' made as non-injecting rectifying contacts connected to the input electrodes 7 and 7' of the logical gate, respectively.

In the version of the circuit shown in FIG. 1 the gate (zones 12 and 12') of the field-effect transistor is arranged as two non-injecting rectifying contacts, the second contact being connected to the complementary input electrode 7'.

Figure 2:
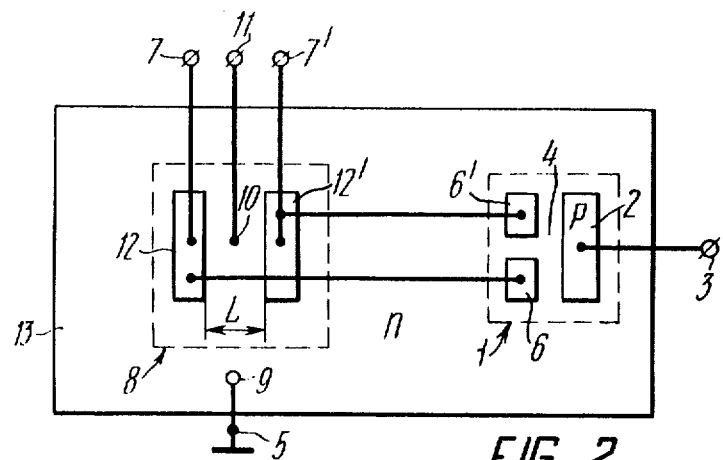
FIG. 2 is a top view of the semiconductor structure of the gate shown in FIG. 1, according to the invention.

Presented in FIG. 2 is an unscaled top or plan diagram of the semiconductor structure of the logical gate shown in FIG. 1.

The notations used in FIG. 2 to denote major components of the circuit are similar to those used in FIG. 1. The current generator comprising the bipolar transistor 1 and the field-effect transistor 8 are made on the same n-type semiconductor substrate 13, the base zone 4 of the transistor 1 and the source zone 9 of the n-channel field-effect transistor 8 being combined.

Figure 3:
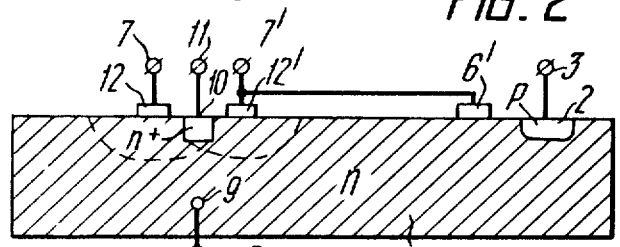
FIG. 3 is a front cross section of the semiconductor structure of the gate shown in FIG. 1, according to the invention.

Presented in FIG. 3 is the same semiconductor structure as shown in FIG. 2, the notations to denote major components of the circuit also being the same. The drain zone 10 of the field-effect transistor 8 is located between the non-injecting rectifying contacts of the gate zones 12 and 12', dashed lines indicating the boundaries of space charge layers of the rectifying contacts between the zones 12 and 12' and the substrate 13.

Figure 4:
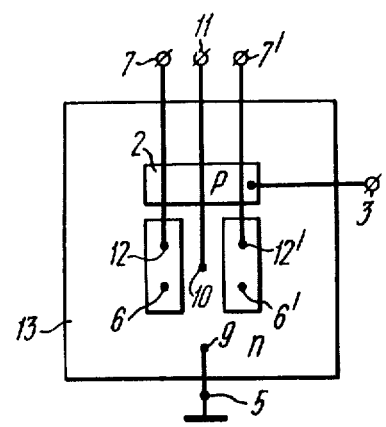
FIG. 4 is a top view of a semiconductor structure, according to the invention, performing the functions of a double-input gate with a current generator made as a bipolar transistor having a metal collector which is combined with the gate of the field-effect transistor.

Presented in FIG. 4 is a diagram of a semiconductor structure performing the functions of a double-input logical gate which comprises a current generator comprising a bipolar transistor with metal collectors combined with the gates of the field-effect transistor. In the present structure the metal collectors 6 and 6' of the bipolar transistor 1 are combined with the gate zones 12 and 12' arranged as metal-semiconductor junctions of the Schottky-diode type.

The present structure makes it possible to increase the packing density due to the fact that said zones 6 and 6' and 12 and 12' are combined and, consequently, there is no interconnections between the collectors 6 and 6' and the gate zones 12 and 12'. It should be pointed out that this zone combination becomes feasible because the current generator comprises a bipolar transistor with a metal collector.

Figure 5:
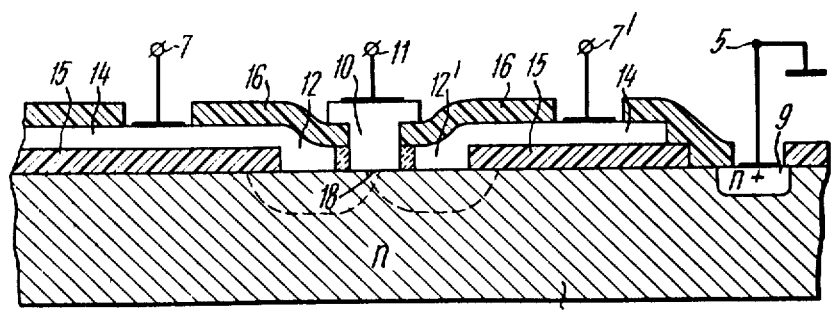
FIG. 5 is a front cross section of the planar semiconductor structure, according to the invention, arranged as a field-effect transistor with gate zones made as interconnection sections.

Presented in FIG. 5 is a planar semiconductor structure of a normally cutoff n-channel field-effect transistor 8 which is an element of the logical gate integrated circuit shown in the circuit diagram of FIG. 1. The remainder of the circuit is made as shown in FIG. 4.

The proposed design of the integrated circuit having a field-effect transistor, the gate zones of which are made as non-injecting contacts, permits the arrangement of the gate zones 12 and 12' as sections of the metal interconnections 14 located on such areas of the substrate 13 that are not protected by a masking dielectric layer 15. This design makes it possible to fabricate the gate zones 12 and 12' simultaneously with the first layer of integrated circuit interconnections. The fact that the drain zone 10 is located above the dielectric layer 16 which protects the interconnections 14 permits the fabrication of the drain zone 10 simultaneously with the second layer of integrated circuit interconnections (not shown in FIG. 5).

Figure 6:
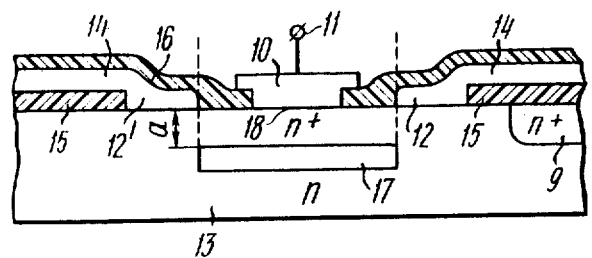
FIG. 6 is a front cross section of the semiconductor structure performing the functions of a field-effect transistor which, according to the invention, is provided with a complementary zone with the conductivity opposite to that of the substrate.

Presented in FIG. 6 is a diagram of another version of the semiconductor structure performing the functions of the field-effect transistor which is an element of the integrated circuit structure proposed herein. The structure differs from the one described above and shown in FIG. 5 in that it is provided with a complementary zone 17 located on the substrate 13 at a distance "a" from the surface, the distance "a" being less than the thickness of the layer of the space charge generated by the non-injecting rectifying contact of the gate zone 12. The type of conductivity of the zone 17 is opposite to that of the substrate 13. In this case it is of the p-type of conductivity. The zone 17 is located so that it overlaps completely the ohmic contact 18 between the drain zone 10 and the substrate 13. The introduction of the complementary zone 17 makes it possible to increase the distance between the gate zones 12 and 12' and to simplify the procedure of fabricating integrated circuits of this type since the requirements for the photomask used to form gate zones become less stringent.

The integrated injection circuit (a logical gate) proposed herein operates as follows. The emitter zone 2 of the bipolar transistor 1 injects holes into the base zone 4. These holes serve as minority carriers for the zone 4. The charge carriers are collected in the zones 6 and 6'. Depending on the voltage across the input electrodes 7 and 7', the logical gate will occupy one of the following states.

If there is a low, close to "ground", voltage across both input electrodes 7 and 7', the charge carriers collected at the junctions of the zones 6 and 6' will "leak off" to "the ground". In this case the output electrode 11 has no direct-current coupling with the "ground" electrode 5. Now, if the gate is loaded with a similar device (not shown in FIG. 1), the electrode 11 will bear a high voltage equal in magnitude to that which opens the junction between the zones 12, 12' and 9.

The direct-current coupling will be broken if the section of the substrate 13 located between the electrodes 11 and 5 is overlapped by the space charge layers of the closed junctions between the zones 12, 12' and 9 (the space charge layers are indicated with dashed lines in FIG. 3).

If the input electrodes 7 and 7' are fed with a high voltage exceeding that required to unlock the junctions between zones 12, 12' and 9, there will appear a direct-current coupling between the electrodes 11 and 5 while the voltage at the output of the logical gate will drop to a level close to that across "the ground" electrode 5. The above direct-current coupling is insured by reducing the size of the space charge zone of the junctions between the zones 12, 12' and 9 in case the voltage across the input electrodes 7 and 7' becomes higher.

If one of the electrodes 7 or 7' is fed with a low voltage, there may be two equally possible results. The first result will take place when the resistivities of the zone 10 and the distance L between the zones 12 and 12' (FIG. 2) are selected so that the width of the space charge layer of the junction between the zones 12 and 9 is greater than or equal to the distance L. The second result will take place when the width of the space charge layer of said junction is smaller than the distance L. In the first case there will be no direct-current coupling between the electrode 11 and the "ground" electrode 5.

Hence, the logical gate proposed herein can perform NOR or NAND logical functions depending upon its structure-topological parameters (the magnitude of L and the resistivity of the zone 10).

The speed of the logical gate is increased by the use of non-injecting rectifying contacts (metal-semiconductor junctions) which serve as the gate zones 12 and 12' and as the collector zones 6 and 6'. Since there is no injection of minority charge carriers from the gate zones 12 and 12', there will be no excess charge in the zone 13. Hence, when the logical gate is switched over from the open state into the closed state, the duration of the transients will be sharply reduced.

The operation of the integrated circuit provided with a field-effect transistor shown in FIG. 6 is as follows.

The complementary zone 13 prevents the current from flowing from the output electrode 11 to the source zone 9 in a direction orthogonal to the surface of the integrated circuit and makes it flow along a trajectory parallel to this surface. If there is a low voltage across the gate zones 12 and 12', the space charge layer will block the path of the current since the complementary zone 17 overlaps completely the ohmic contact of the drain zone 10. The zone 17 can be either connected to "the ground" or fed with a bias voltage from an additional power supply.

The integrated circuit proposed herein is easy in production and can be manufactured with the use of planar technology with or without resorting to epitaxial films.

A broad field of functional applications and a high speed of operation make the integrated circuit proposed herein quite useful in the design of large-scale integrated devices having a high packing density of components on the chip.

What is claimed is:

1. An integrated injection circuit comprising: a current generator connected to a supply source and to ground; a normally cutoff n-channel field-effect transistor comprising a gate connected to said current generator and comprising at least one non-injecting rectifying contact, a source connected to ground, and a drain; an input electrode of the circuit connected to said gate of said FET and to said current generator; and, an output electrode of the circuit connected to the drain of said FET.

2. An integrated injection circuit as claimed in claim 1, wherein said FET comprises two non-injecting rectifying contacts; and further comprising a second input electrode connected to said current generator, said first and second contacts of said FET being respectively connected to said first and second input electrodes.

3. An integrated injection circuit as claimed in claim 2, wherein said current generator comprises a bipolar transistor with a base connected to said ground, metal collectors connected to said gate of said FET and to said first and second input electrodes, and an emitter connected to said supply source.

4. An integrated injection circuit as claimed in claim 3, wherein the circuit is formed on a surface of a n-type semiconductor substrate, the base of said bipolar transistor and said source of said FET being combined, and the drain of said FET being between said non-injecting rectifying contacts of said gate of said FET.

5. An integrated injection circuit as claimed in claim 4, wherein said collectors of said bipolar transistor and said contact of said gate of said FET are combined and arranged as metal-semiconductor junections.

6. An integrated injection circuit as claimed in claim 5, wherein metal-semiconductor junctions include Schotty diodes.

7. An integrated injection circuit as claimed in claim 5, wherein a first dielectric layer is formed on said surface of said substrate except where said contacts of said gate and said drain of said FET are formed, said first dielectric layer is between said metal collectors of said bipolar transistor and said substrate, a second dielectric layer is formed on said contacts of said gate of said FET and said collectors of said bipolar transistor, and said drain of said FET is above said second dielectric layer and is in contact with said surface of said substrate.

8. An integrated injection circuit as claimed in claim 7, wherein said substrate includes a p-type complementary zone located a distance "a" from the surface of said substrate, the distance "a" being less than the thickness of the layer of space charge generated by said contacts of said gate of said FET.

9. An integrated injection circuit as claimed in claim 8, wherein said complementary zone completely overlaps an ohmic contact between said drain of said FET and said surface of said substrate.

10. An integrated injection circuit as claimed in claim 8, wherein the width of the space charge layer of a junction between said contacts of said gate and said source of said FET is at least equal to the distance between said contacts of said gate of said FET.

11. An integrated injection circuit as claimed in claim 8, wherein the width of the space charge layer of a junction between said contacts of said gate and said source of said FET is less than the distance between said contacts of said gate of said FET.

* * * * *